(12) United States Patent
Chou et al.

(10) Patent No.: US 7,686,474 B2
(45) Date of Patent: Mar. 30, 2010

(54) LIGHT EMITTING DEVICE

(75) Inventors: Wei-Jen Chou, Hsinchu (TW); Wei-Chih Wang, Hsinchu (TW)

(73) Assignee: Young Lighting Technology Corporation, Hsin-Chu (TW)

( * ) Notice: Subject to any disclaimer, the term of this patent is extended or adjusted under 35 U.S.C. 154(b) by 41 days.

(21) Appl. No.: 11/740,933

(22) Filed: Apr. 27, 2007

(65) Prior Publication Data

US 2008/0043465 A1 Feb. 21, 2008

(30) Foreign Application Priority Data

Jul. 4, 2006 (TW) .............................. 95124289 A

(51) Int. Cl.
*F21V 1/00* (2006.01)
(52) U.S. Cl. .................. 362/237; 362/244; 362/331
(58) Field of Classification Search .............. 362/244, 362/237, 236, 238, 240, 235, 330–334, 336–338, 362/800; 359/639, 619, 620
See application file for complete search history.

(56) References Cited

U.S. PATENT DOCUMENTS

| | | | | |
|---|---|---|---|---|
| 1,848,685 A | * | 3/1932 | Wyatt | 362/240 |
| 4,951,179 A | * | 8/1990 | Machida | 362/522 |
| 5,119,235 A | * | 6/1992 | Umeda et al. | 359/619 |
| 6,236,477 B1 | * | 5/2001 | Ishihara et al. | 359/640 |
| 6,375,340 B1 | * | 4/2002 | Biebl et al. | 362/294 |
| 6,561,663 B2 | * | 5/2003 | Adachi et al. | 362/616 |
| 6,666,569 B2 | * | 12/2003 | Obata | 362/339 |
| 6,964,497 B2 | * | 11/2005 | Greiner | 362/241 |
| 7,125,141 B2 | * | 10/2006 | Pao et al. | 362/225 |
| 7,255,456 B2 | * | 8/2007 | Yao et al. | 362/225 |
| 7,341,358 B2 | * | 3/2008 | Hsieh et al. | 362/97 |
| 2008/0030994 A1 | * | 2/2008 | Chang | 362/330 |

FOREIGN PATENT DOCUMENTS

CN 1217479 5/1999

* cited by examiner

*Primary Examiner*—Gunyoung T Lee
(74) *Attorney, Agent, or Firm*—Jianq Chyun IP Office

(57) ABSTRACT

A light emitting device including a substrate, a plurality of light sources and a lens array is provided. The light sources and the lens array are disposed on the substrate, and the light sources are arranged to a polygon. The lens array includes a plurality of first lenses and a plurality of second lenses. The first lenses surrounded by the second lenses cover the light sources and respectively correspond to one of the light sources.

16 Claims, 15 Drawing Sheets

230d

LIGHT EMITTING DEVICE

CROSS-REFERENCE TO RELATED APPLICATION

This application claims the priority benefit of Taiwan application serial no. 95124289, filed Jul. 4, 2006. All disclosure of the Taiwan application is incorporated herein by reference.

BACKGROUND OF THE INVENTION

1. Field of Invention

The present invention relates to a light emitting device, and more particularly to a light emitting device with uniform distribution of light emitting intensity.

2. Description of Related Art

Referring to FIG. 1A, FIG. 1B and FIG. 2, the conventional light emitting device 100 comprises a substrate 110, a plurality of light-emitting diode (LED) chips 120 and a lens array 130. The LED chips 120 are disposed on the substrate 110, and arranged in a 2×2 array. The lens array 130 is disposed on the substrate 110, and wraps the LED chips 120. The lens array 130 comprises a plurality of lenses 132, wherein each lens 132 corresponds to an LED chip 120, and the light exit surface 133 of each lens 132 is a pyramidal recessed surface.

Accordingly, the lens array 130 is used to increase the light emitting amount of the LED chip 120, so as to prevent the light emitted by the LED chips 120 from generating total reflection in the LED chips 120 and then failing to emit out of the LED chips 120. Moreover, the LED chips 120 comprises a red light LED chip 121, a blue light LED chip 122 and two green light LED chips 123. The red light, green light and blue light emitted by the LED chips 120 can be blended to form the white light.

However, for FIG. 1B, a lens 130 wrapping the green light LED chip 123 exists on the left of the red light LED chip 121, and no lens exists on the right of the red light LED chip 121, such that the light-emitting pattern of the light 124 emitted by the red light LED chip 121 is asymmetric. Similarly, in different cross-sections, the problem of the asymmetric light-emitting pattern also exists. It is found in the practical measurement that the phenomenon of asymmetric light-emitting pattern is quite distinct.

FIGS. 3A to 3D are respectively light-emitting pattern views of the red light LED chip measured from the viewing surfaces S1 to S4 in FIG. 1A. Referring to FIGS. 3A to 3D, it is shown from FIGS. 3A to 3C that the light-emitting patterns of the red light LED chip 121 measured from the viewing surfaces S1 to S3 (referring to FIG. 1A) are relatively asymmetric. In other words, the distribution of the light emitting intensity of the red light of the light emitting device 100 is asymmetric. Similarly, the distribution of the light emitting intensity of the blue light and the green light of the light emitting device 100 may also be asymmetric, such that the problem of non-uniform blending of the light may be generated, and the light from the specific angles may be bluish, greenish, or reddish.

SUMMARY OF THE INVENTION

Accordingly, an objective of the present invention is to provide a light emitting device with relatively uniform distribution of light emitting intensity.

In order to achieve the above or another objective, the present invention provides a light emitting device, which comprises a substrate, a plurality of light sources and a lens array. The light sources and the lens array are disposed on the substrate, and the light sources are arranged to a polygon. The lens array comprises a plurality of first lenses and a plurality of second lenses, and the first lenses surrounded by the second lenses cover the light sources and respectively correspond to one of the light sources.

In an embodiment of the present invention, the lens array has a plurality of second lenses surrounding the first lenses corresponding to the light sources, the light-emitting pattern of each light source emerging from the lens array is relatively symmetric, and the distribution of light emitting intensity of the light emitting device of the present invention is relatively uniform.

Other objectives, features and advantages of the present invention will be further understood from the further technology features disclosed by the embodiments of the present invention wherein there are shown and described preferred embodiments of this invention, simply by way of illustration of modes best suited to carry out the invention.

In order to the make aforementioned and other objects, features and advantages of the present invention comprehensible, a preferred embodiment accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "right," "left," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "surrounded," and variations thereof herein are used broadly and encompass direct and indirect surroundings. Accordingly, the drawings and descriptions will be regarded as illustrative in nature and not as restrictive.

Figure 4A:
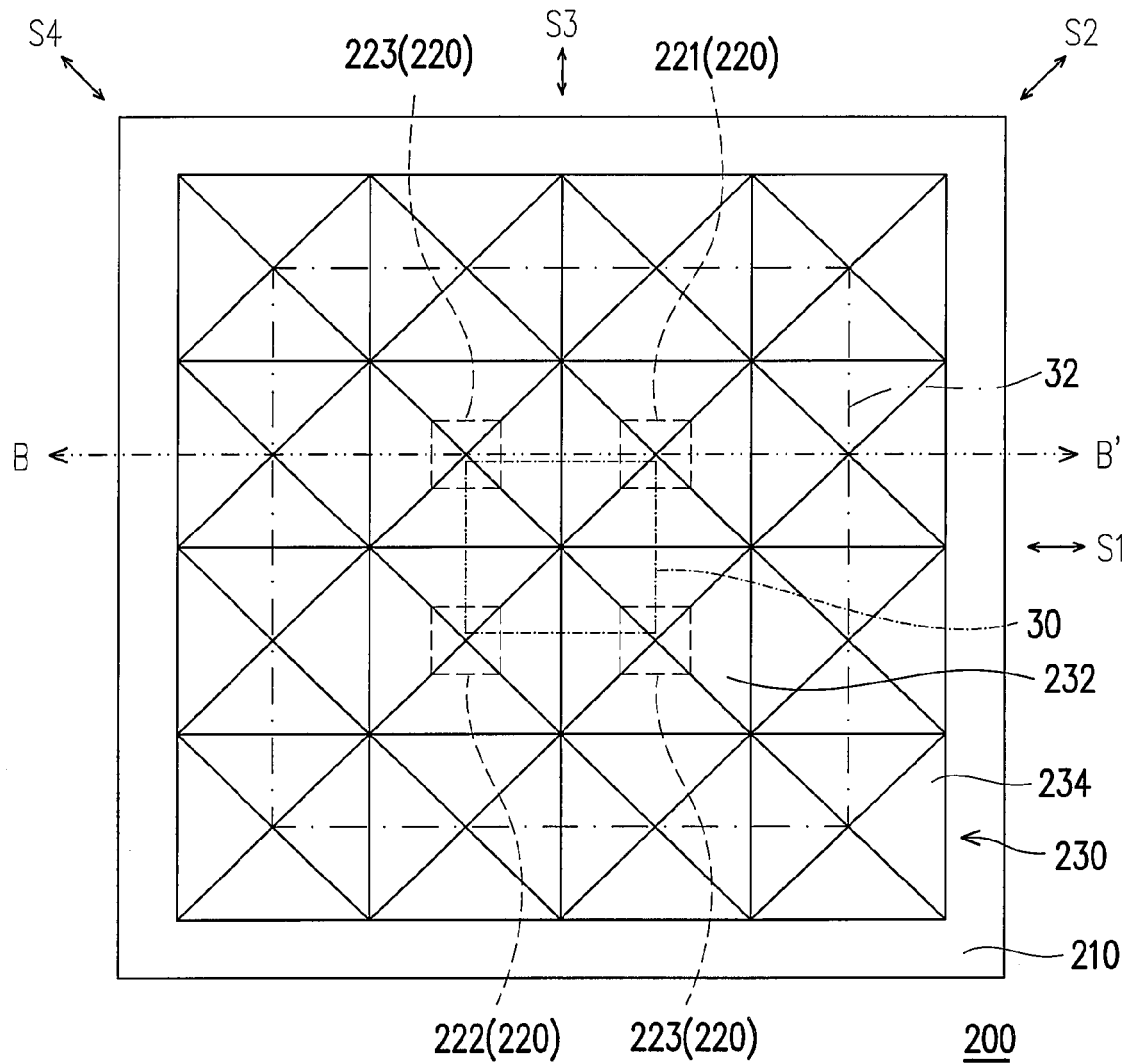
FIG. 4A is a top view of the light emitting device according to an embodiment of the present invention.
Figure 4B:
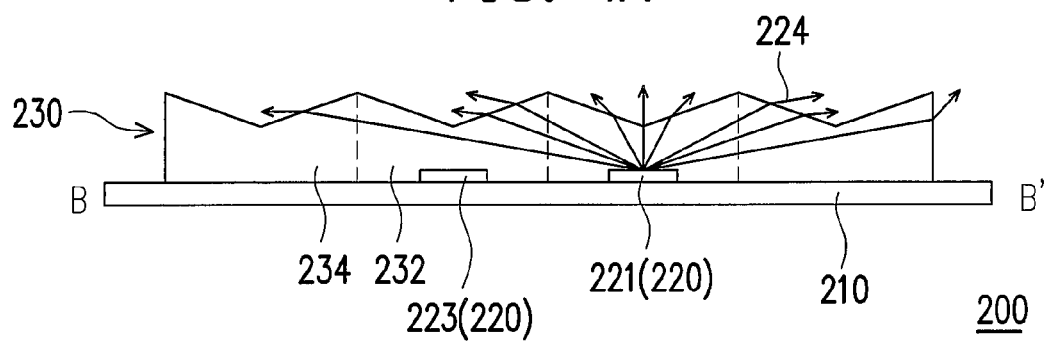
FIG. 4B is a cross-sectional view along the B-B' line in FIG. 4A.
Figure 5:
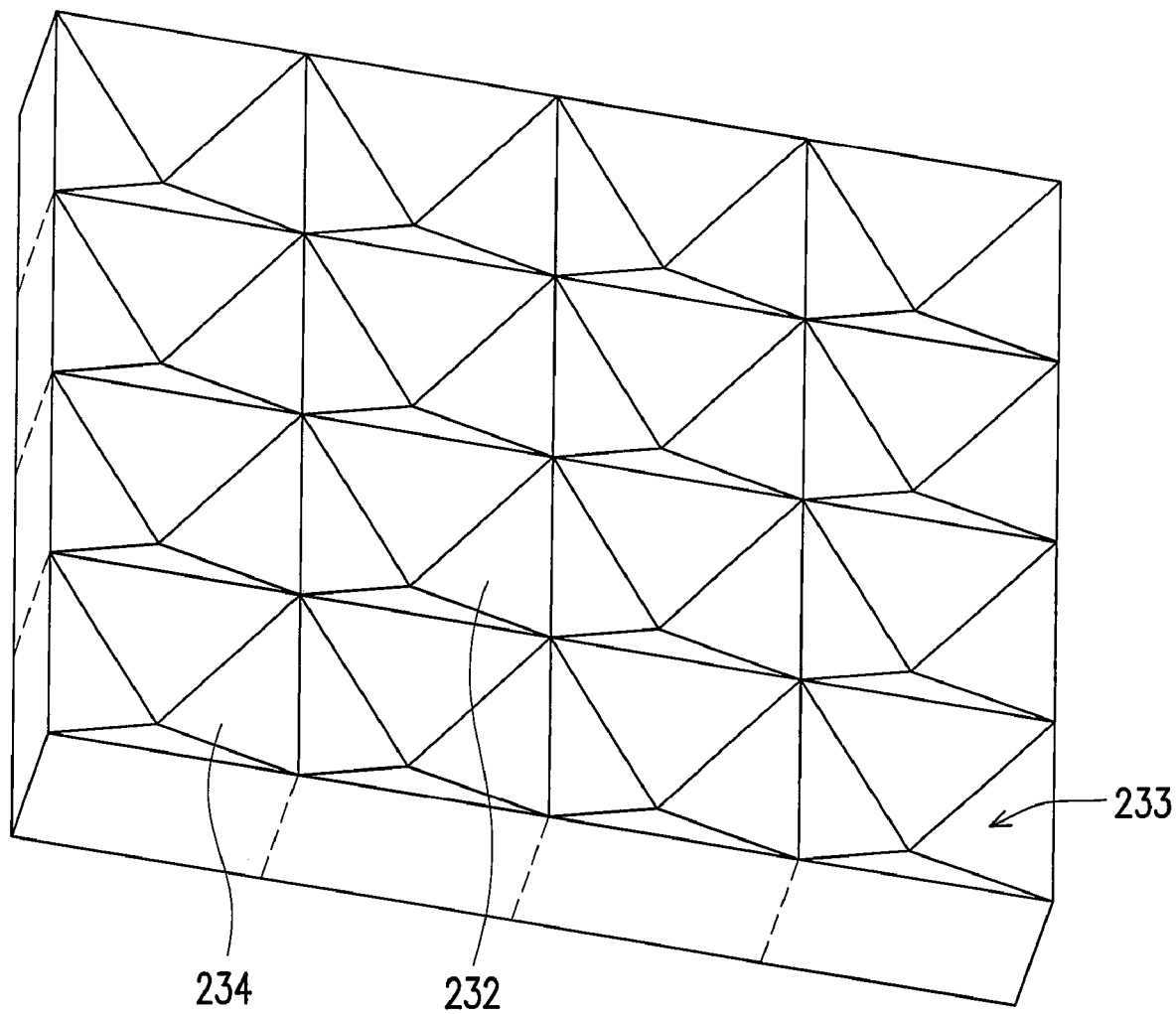
FIG. 5 is a perspective view of the lens array in FIG. 4A.

Referring to FIG. 4A, FIG. 4B and FIG. 5, the light emitting device 200 of the present embodiment comprises a substrate 210, a plurality of light sources 220 and a lens array 230. The light sources 220 and the lens array 230 are disposed on the substrate 210, and the light sources 220 are arranged to a polygon in a N×N array, wherein N is a positive integer. The lens array 230 comprises a plurality of first lenses 232 and a plurality of second lenses 234. The first lenses 232 cover the light sources 220 and each of which respectively corresponds to one of the light sources 220, and the second lenses 234 surround the first lenses 232. The lens array 230 is a M×M array, wherein M is a positive integer and N is smaller than M.

In the present embodiment, the quantity of the light sources 220 is, for example, four, and the light sources 220 are arranged to a quadrangle 30 in a 2×2 array on the substrate 210. Moreover, the light sources 220 are, for example, LED chips, and the colors of the lights emitted from the light sources 220 are different. More particularly, the light sources 220 comprise a red light source 221, a blue light source 222 and two green light sources 223. Further, the lens array 230 is a 4×4 array, and the lens array 230 is formed integrally. The first lenses 232 are arranged to the shape of quadrangle 30, and the second lenses 234 are arranged, for example, to a quadrangle 32. The light exit surfaces 233 of the first lenses 232 and the second lenses 234 are, for example, recessed surfaces.

Figure 1A:
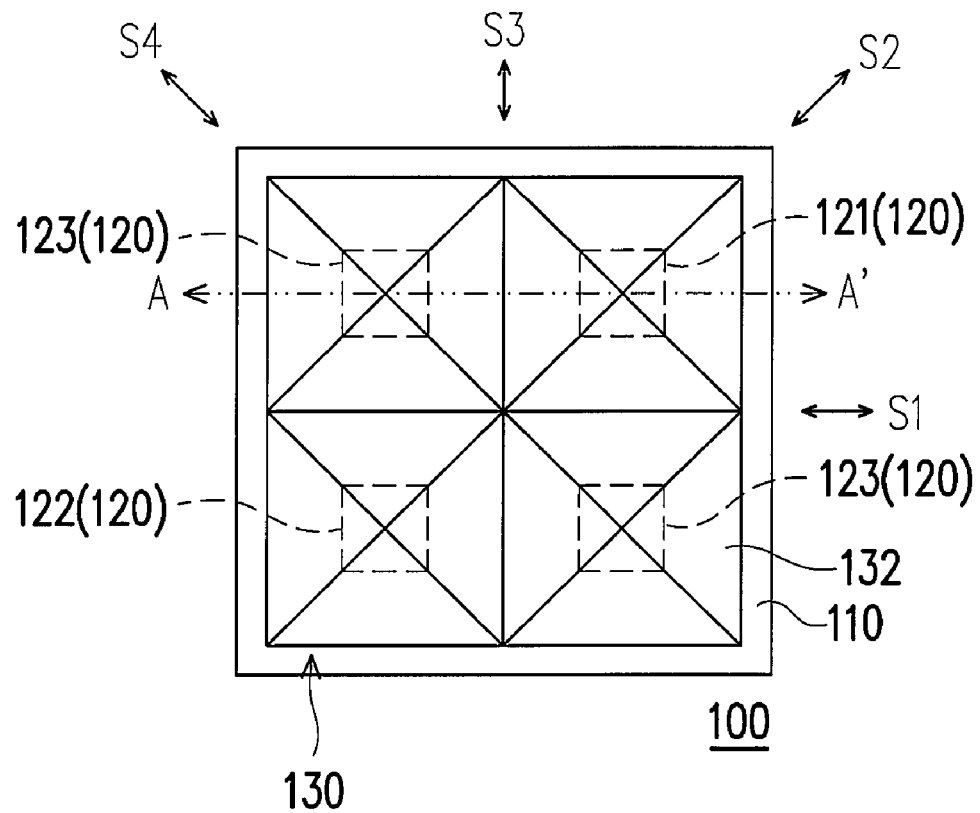
FIG. 1A is a top view of a conventional light emitting device.
Figure 1B:
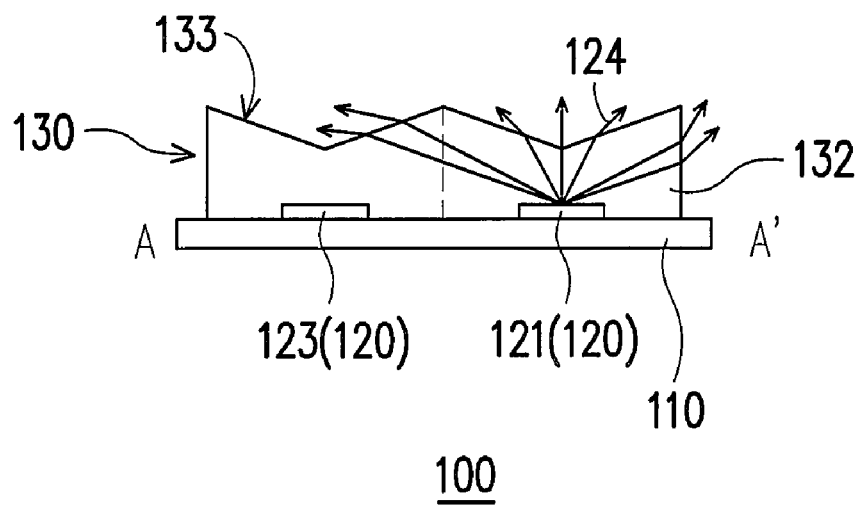
FIG. 1B is a cross-sectional view along the A-A' line in FIG. 1A.
Figure 2:
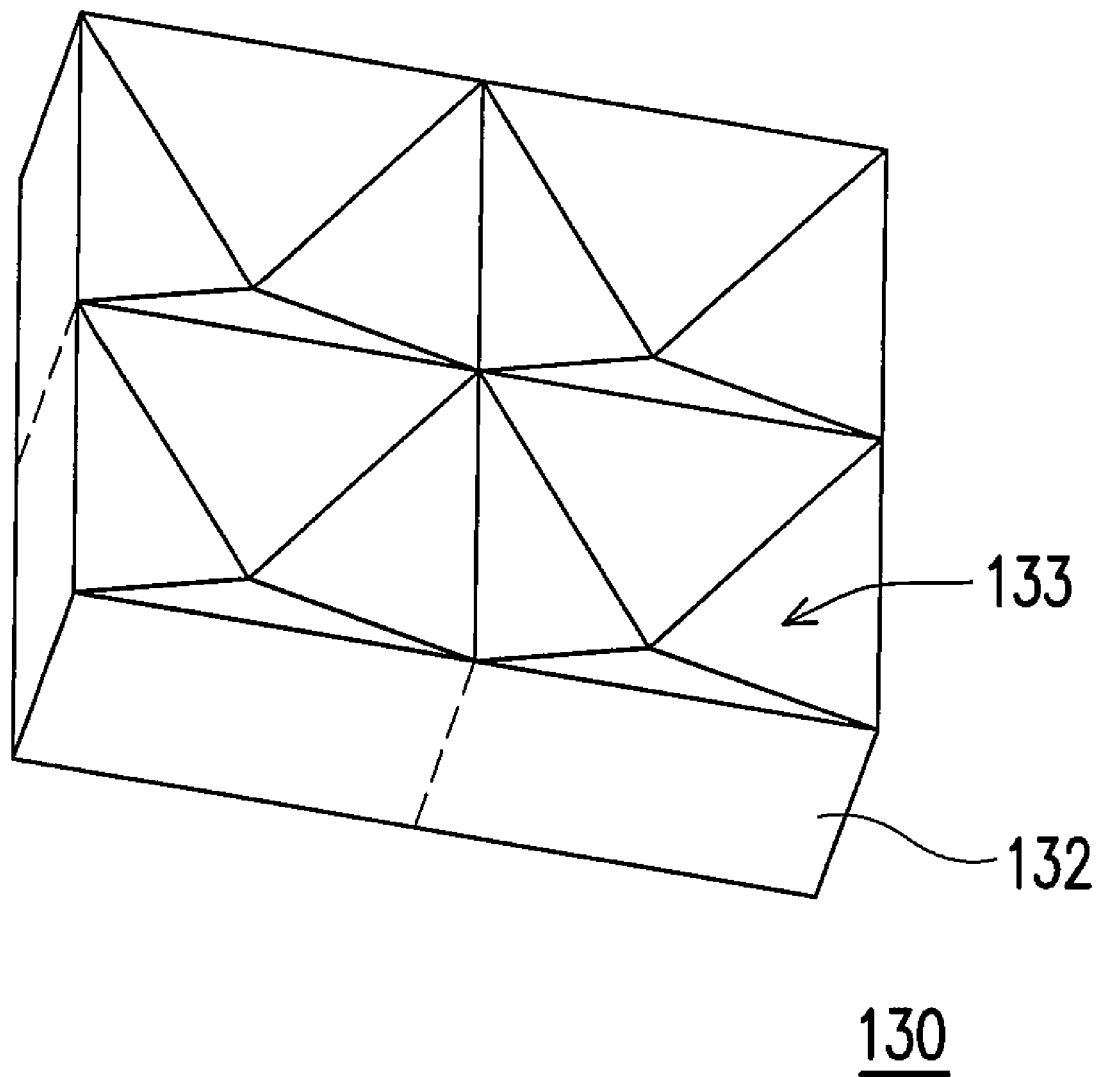
FIG. 2 is a perspective view of the lens array in FIG. 1A.

In the light emitting device 200, the first lenses 232 of the lens array 230 are used to increase the light emitting amount of the light sources 220, so as to prevent the light emitted by the light sources 220 from generating total reflection in the light sources 220 and then failing to emit out of the LED chips 120. Moreover, the first lenses 232 and the second lenses 234 surrounding the first lenses 232 are used to modify the pattern of the light emitted by the light sources 220 after emerging from the lens array 230. For example, it can be seen from FIG. 4B that a first lens 232 covering the green light source 223 and a second lens 234 exist on the left of the red light source 221, and a second lens 234 exists on the right of the red light source 221. Compared with the red light LED chip 121 of FIG. 1B without any lens existing on the right, the pattern of the light 224 provided by the red light source 221 of the present embodiment after emerging from the lens array 230 is relatively symmetric, i.e. the distribution of light emitting intensity of the light 224 provided by the red light source 221 is relatively symmetric.

Figure 3A:
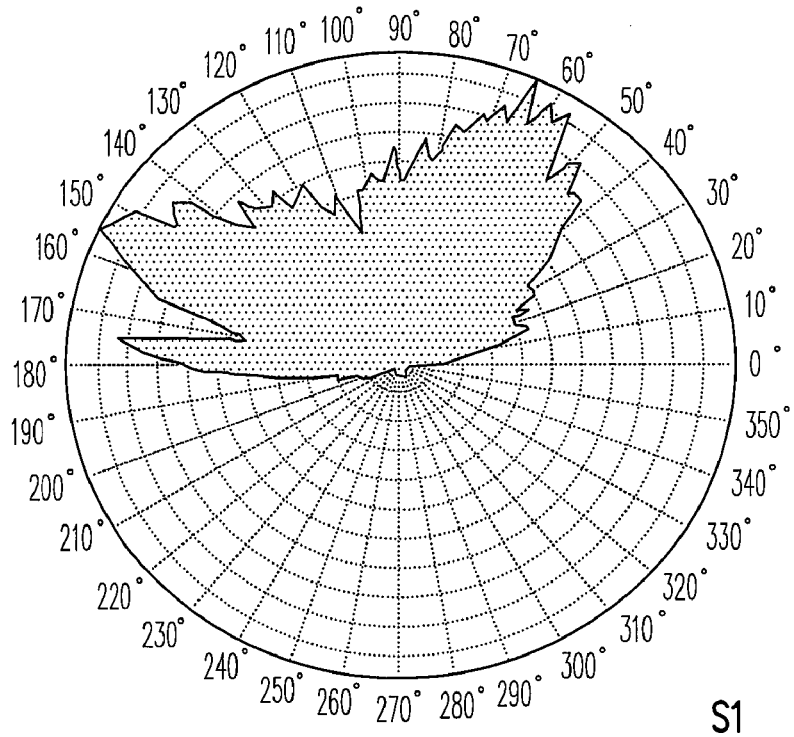
FIGS. 3A to 3D are respectively light-emitting pattern views of the red light LED chip measured from the viewing surfaces S1 to S4 in FIG. 1A.
Figure 3B:
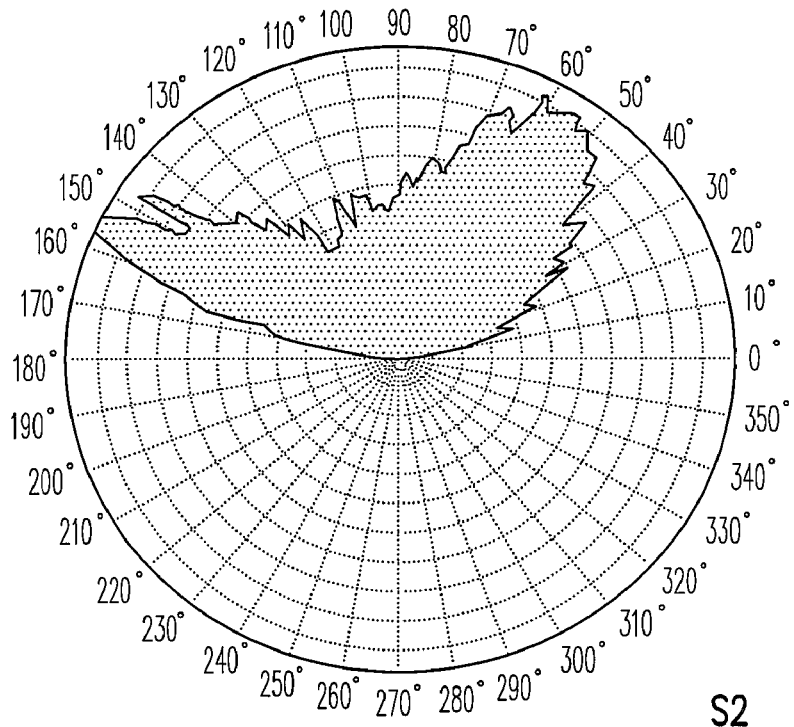
Figure 3C:
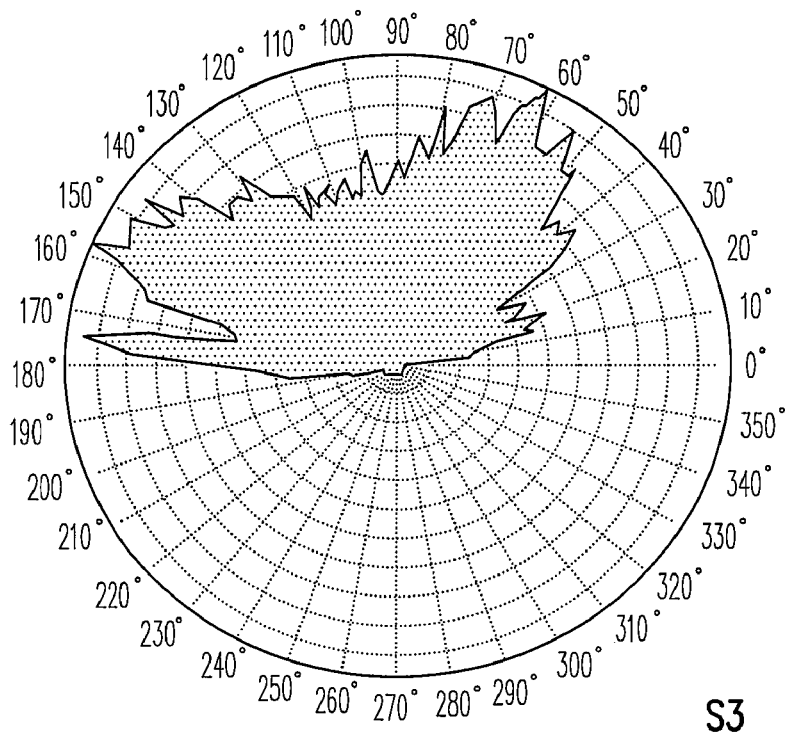
Figure 3D:
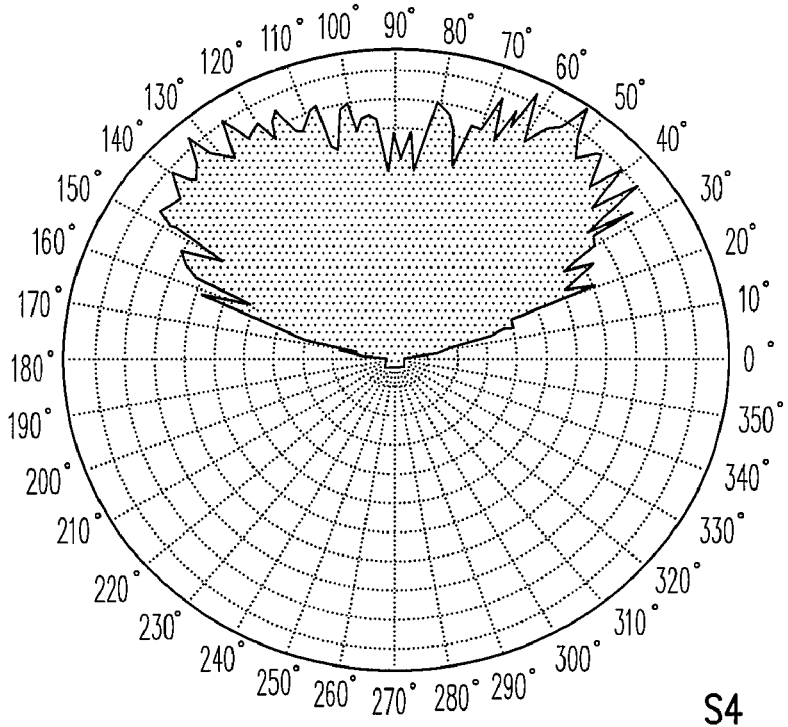
Figure 6A:
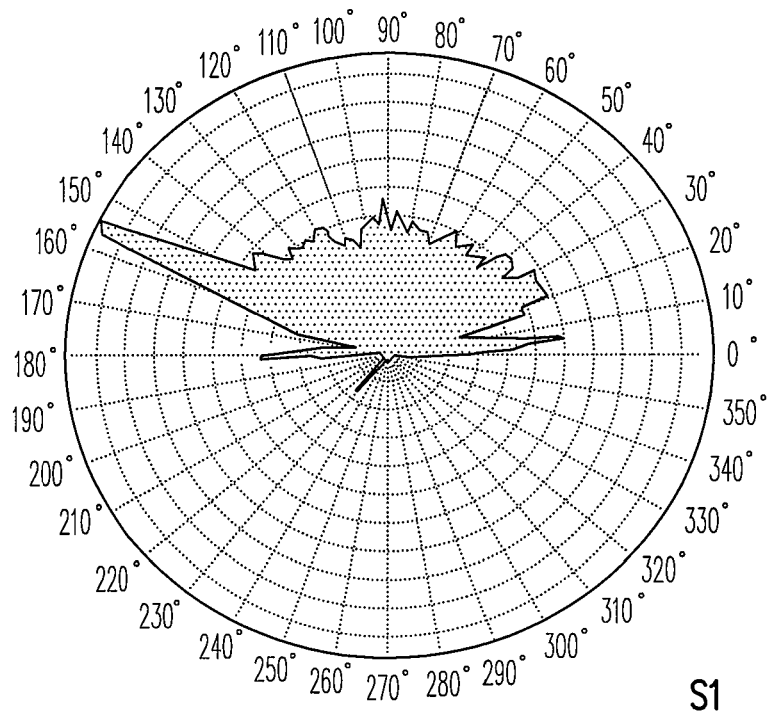
FIGS. 6A to 6D are respectively light-emitting pattern views of the red light source measured from the viewing surfaces S1 to S4 in FIG. 4A.
Figure 6B:
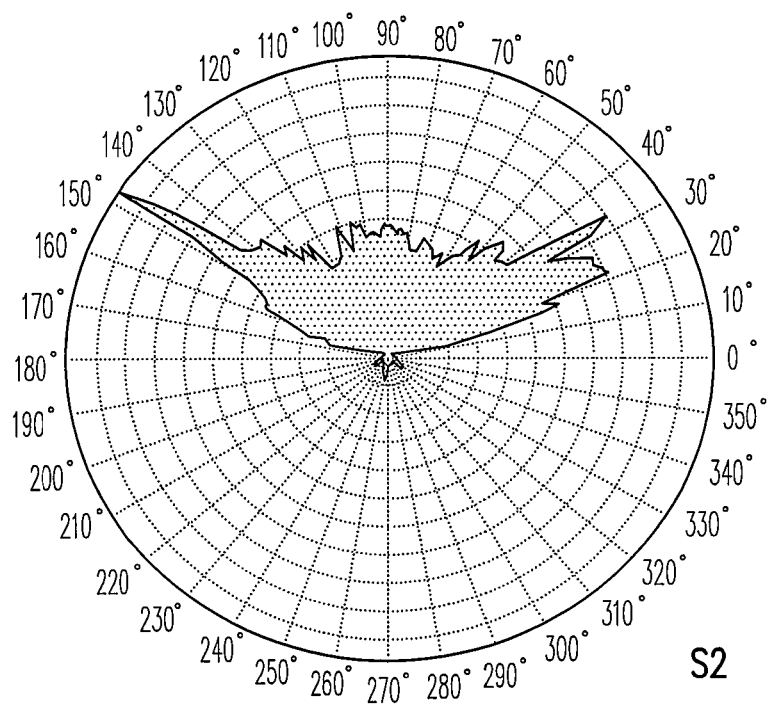
Figure 6C:
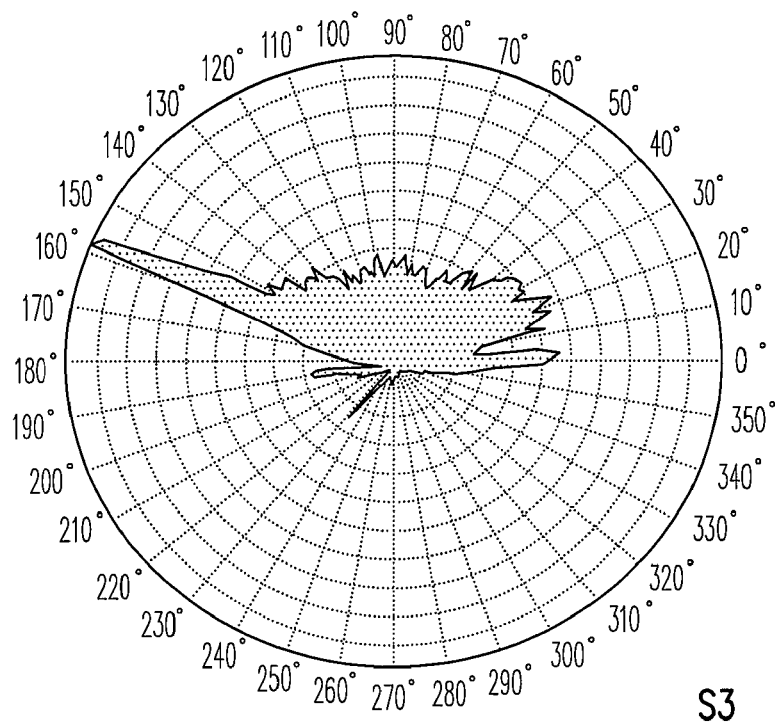
Figure 6D:
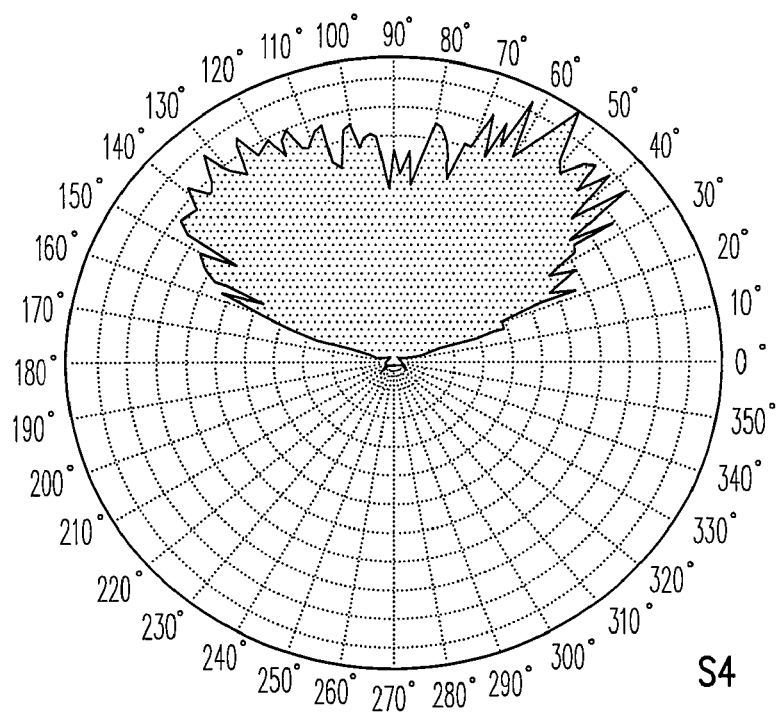

The light-emitting pattern views as shown in FIGS. 6A to 6D are respectively the light-emitting pattern views of the red light source measured from the viewing surfaces S1 to S4 in FIG. 4A. As compared with the light-emitting pattern views measured from the viewing surfaces S1 to S3 in FIG. 1A (i.e. FIGS. 3A to 3C), the light-emitting pattern views shown in FIGS. 6A to 6C are relatively symmetric, so the distribution of light emitting intensity of the red light source 221 of the light emitting device 200 in the present embodiment is relatively symmetric. Similarly, the distributions of light emitting intensity of the blue light source 222 and the green light sources 223 of the light emitting device 200 are relatively symmetric as well. As such, the light emitting device 200 has preferred blending effect, thus the light from the specific angles is not bluish, greenish, or reddish.

It should be noted that the color of the light emitted from each light source 220 of the present embodiment may also be the same, and under this condition, the light emitting device 200 has the advantage that the distribution of the light emitting intensity is relatively symmetric.

Moreover, in the present embodiment, the light exit surfaces 233 of the first lenses 232 and the second lenses 234 are pyramidal recessed surfaces, but the present invention does not limit the shape of the light exit surfaces 233. In the present invention, the shape of the light exit surface of the lens is changed to make the lens have the focusing or diffusing function, thereby the corresponding light exit surface is designed in accordance with the required light-emitting pattern. Three shapes of the light exit surfaces 233 of the first lenses 232 and the second lenses 234 are described as examples as follows, and those skilled in the art may make suitable changes for the shape with reference to the present invention, without departing from the scope of the present invention.

Figure 7A:
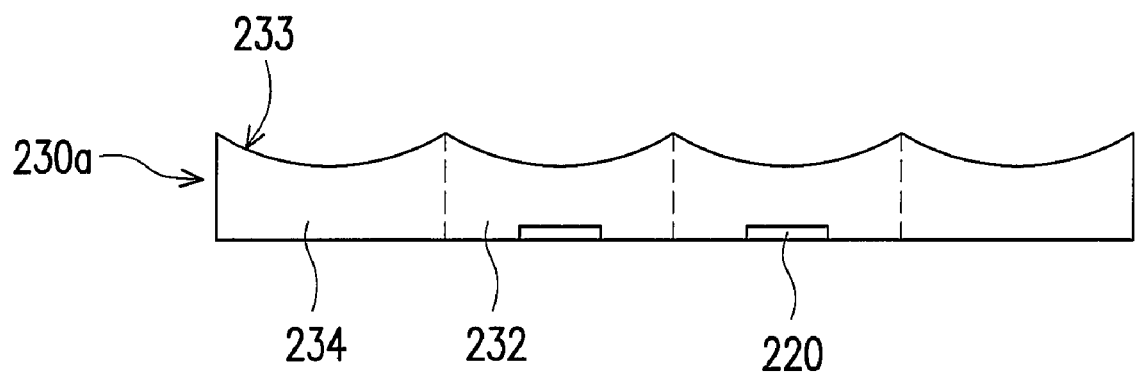
FIGS. 7A to 7C are cross-sectional views of three lens arrays and the light sources according to another embodiment of the present invention.
Figure 7B:
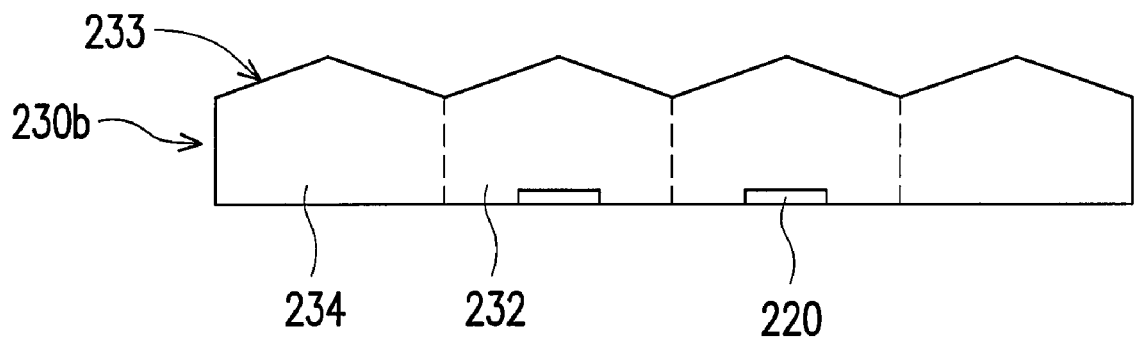
Figure 7C:
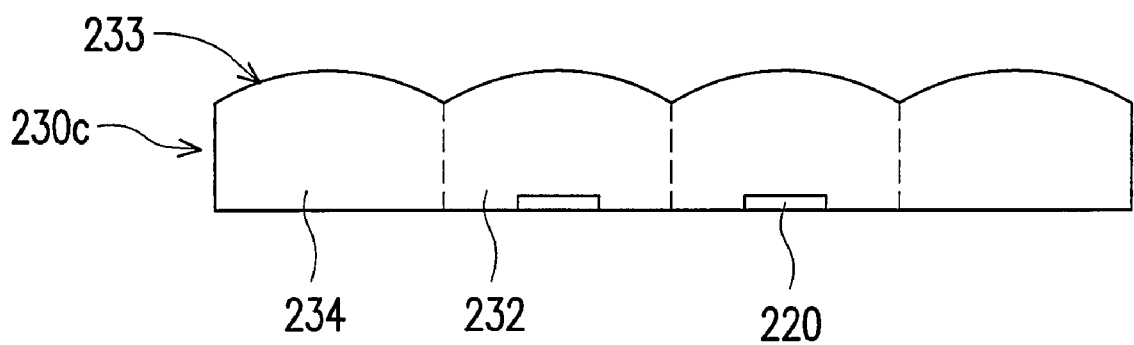

FIGS. 7A to 7C are schematic cross-sectional views of three lens arrays and light sources according to another embodiment of the present invention. Referring to FIGS. 7A to 7C, the lens array 230a of the present embodiment is similar to the lens array 230 as shown in FIG. 4B, except that the light exit surfaces 233 of the first lenses 232 and second lenses 234 of the lens array 230a are circular-arc recessed surfaces. Moreover, as shown in FIG. 7B and FIG. 7C, the light exit surfaces 233 of the first lenses 232 and second lenses 234 are also protruding surfaces, wherein the light exit surfaces 233 of the first lenses 232 and second lenses 234 of the lens array 230b are, for example, pyramidal protruding surfaces, and the light exit surfaces 233 of the first lenses 232 and second lenses 234 of the lens array 230c are circular-arc protruding surfaces.

Figure 8A:
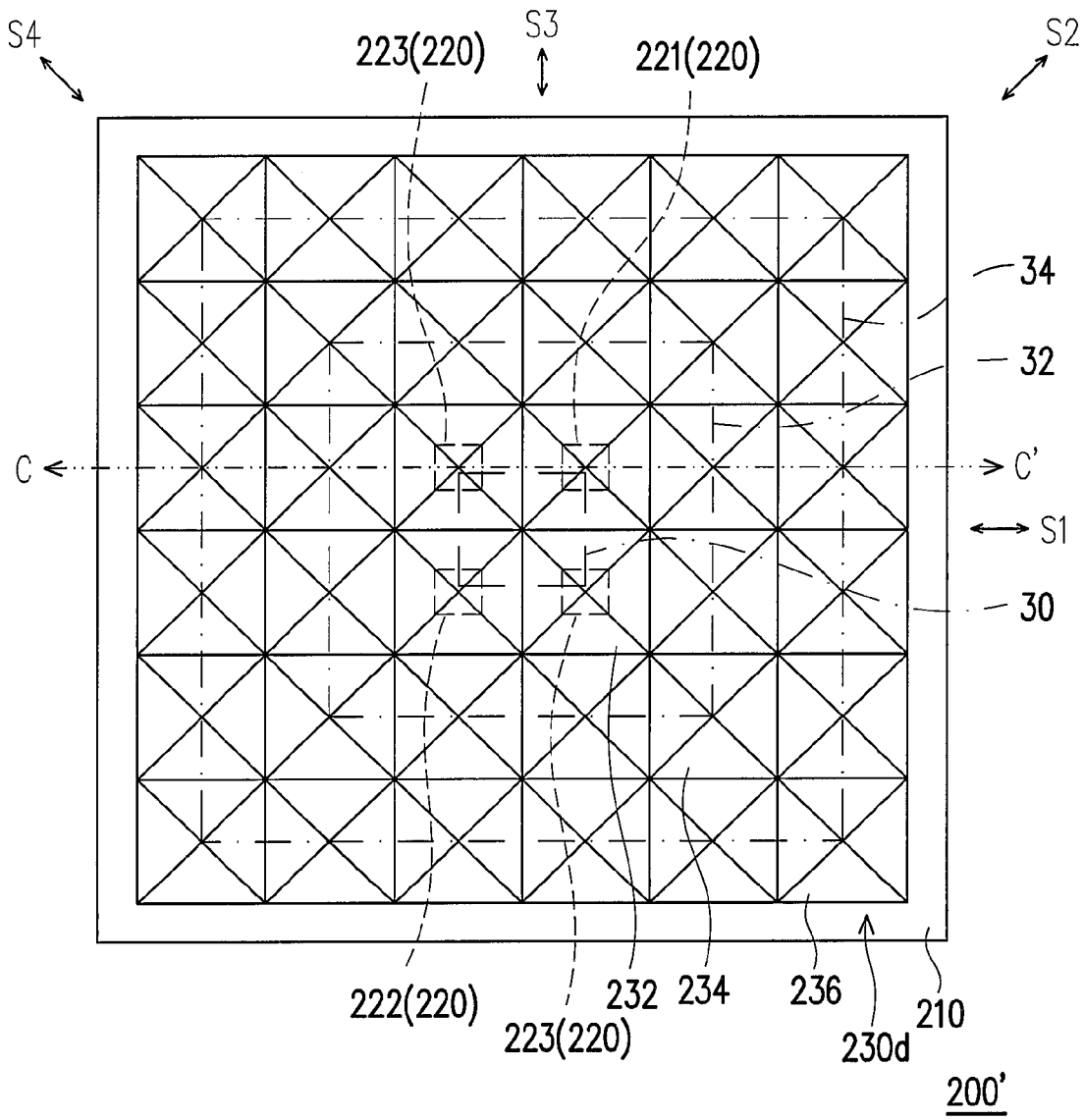
FIG. 8A is a top view of the light emitting device according to another embodiment of the present invention.
Figure 8B:
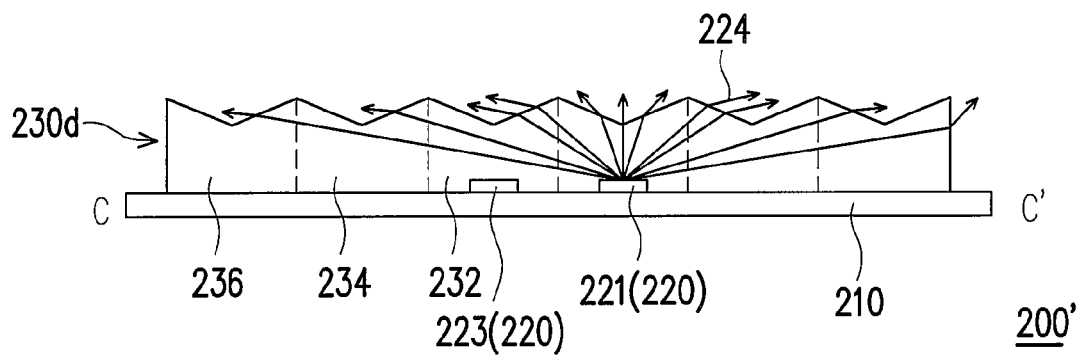
FIG. 8B is a cross-sectional view along the C-C' line in FIG. 8A.
Figure 9:
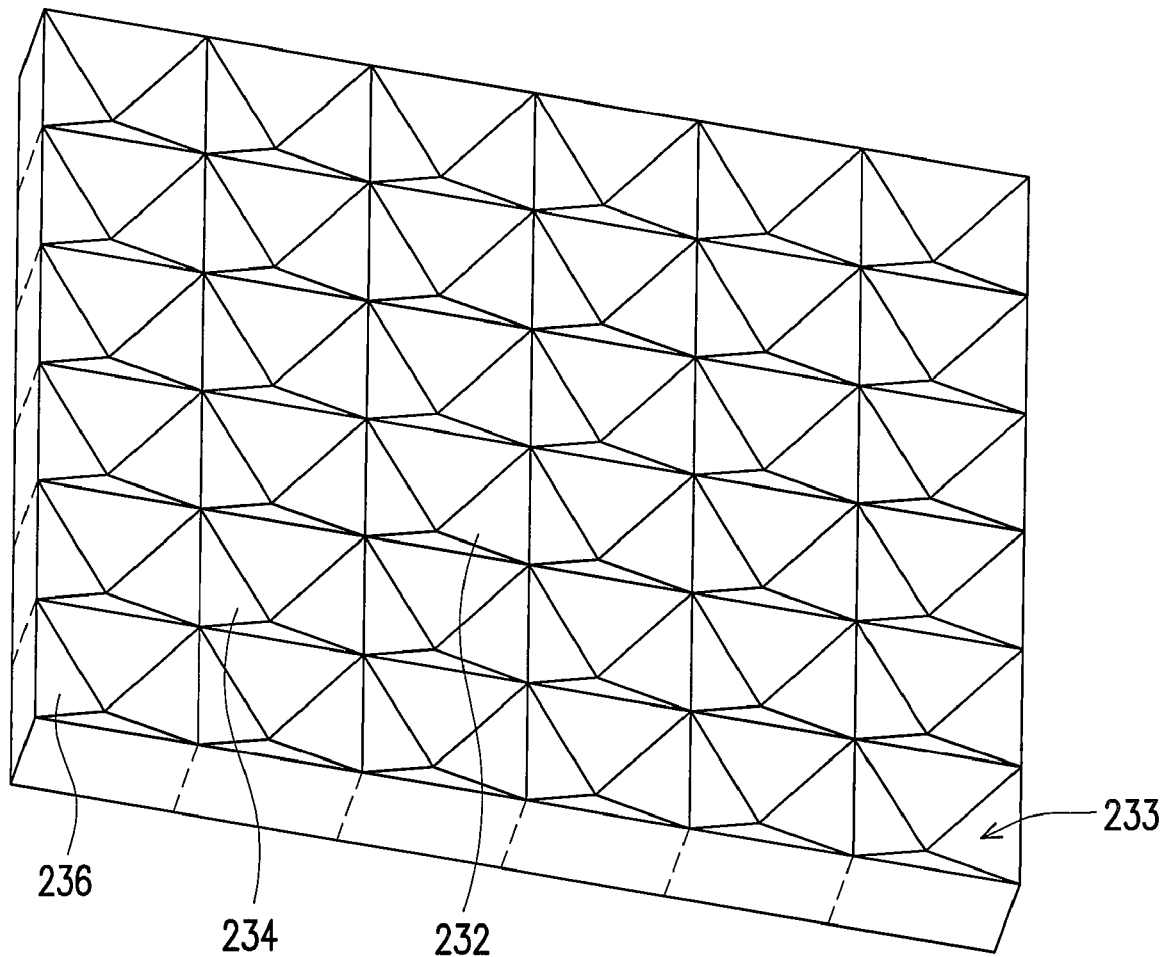
FIG. 9 is a perspective view of the lens array in FIG. 8A.

FIG. 8A is a top view of the light emitting device according to another embodiment of the present invention, FIG. 8B is a schematic cross-sectional view along the C-C' line in FIG. 8A, and FIG. 9 is a stereogram of the lens array in FIG. 8A. Referring to FIG. 8A, FIG. 8B and FIG. 9, the light emitting device 200' of the present embodiment is similar to the light emitting device 200 as shown in FIG. 4A, except that the lens array 230d is a 6×6 array. More particularly, the light emitting device 200' comprises the first lenses 232 and the second lenses 234; in addition, it further comprises a plurality of third lenses 236 surrounding the second lenses 234, and the third lenses 236, for example, are arranged to a quadrangle 34. The shapes of the light exit surfaces 233 of the first lenses 232, the second lenses 234 and the third lenses 236 are the same. The third lenses 236 further increases the blending effect of the light emitting device 200'. More particularly, in FIG. 8B, a first lens 232 covering the green light source 223, a second lens 234 and a third lens 236 exist on the left of the red light source 221, and a second lens 234 and a third lens 236 exist on the right of the red light source 221. Compared with that of FIG. 4B, in FIG. 8B, the quantities of the lenses on the left and the right of the red light source 221 are relatively symmetric, such that the pattern of the light 224 provided by the red light source 221 after emerging from the lens array 230d becomes more symmetric.

Figure 10A:
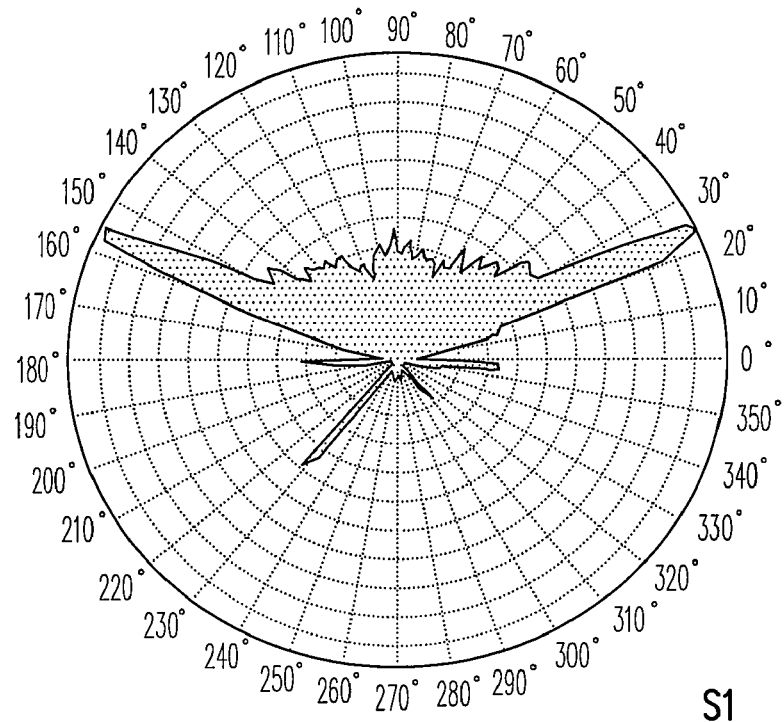
FIGS. 10A to 10D are respectively light-emitting pattern views of the red light source measured from the viewing surfaces S1 to S4 in FIG. 8A.
Figure 10B:
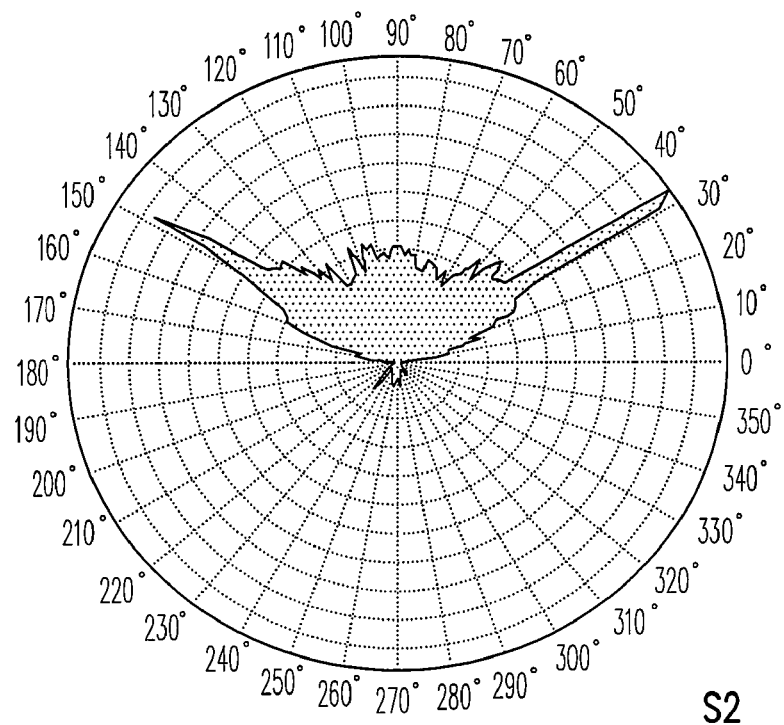
Figure 10C:
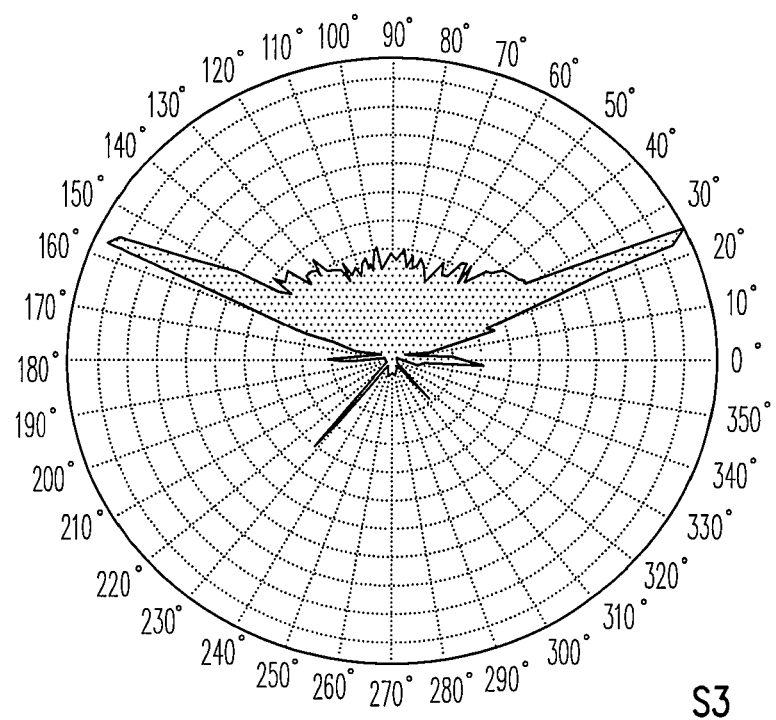
Figure 10D:
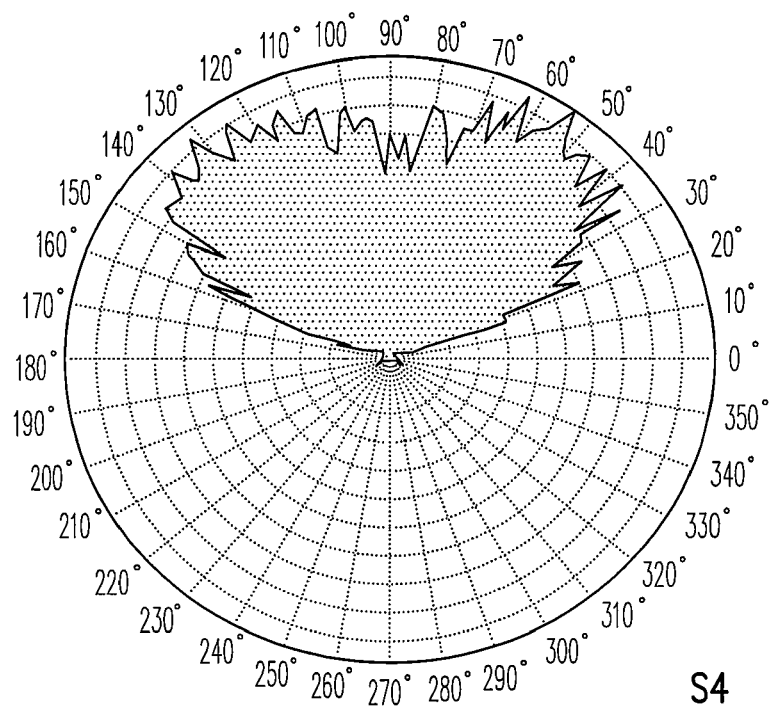

FIGS. 10A to 10D are respectively light-emitting pattern views of the red light source measured from the viewing surfaces S1 to S4 in FIG. 8A. Compared with the light-emitting pattern views measured from the viewing surfaces S1 to S3 in FIG. 4A (i.e. FIGS. 6A to 6C), the light-emitting pattern views shown in FIGS. 10A to 10C are more symmetric, i.e. the distribution of the light emitting intensity of the red light source 221 of the light emitting device 200' in the present embodiment is more symmetric. Similarly, the distributions of the light emitting intensity of the blue light source 222 and the green light sources 223 of the light emitting device 200' are relatively symmetric, such that the light emitting device 200' has the preferred blending effect.

It is noted that, for example, the lens array of the present invention is 8×8 array, i.e. a plurality of fourth lenses (not shown) surrounding the third lenses 236 which is added, so as to further increase the blending effect of the light emitting device. Moreover, those skilled in the art may add more layers of lenses surrounding the fourth lenses after referring to the present invention, without departing from the scope of the present invention.

Figure 11:
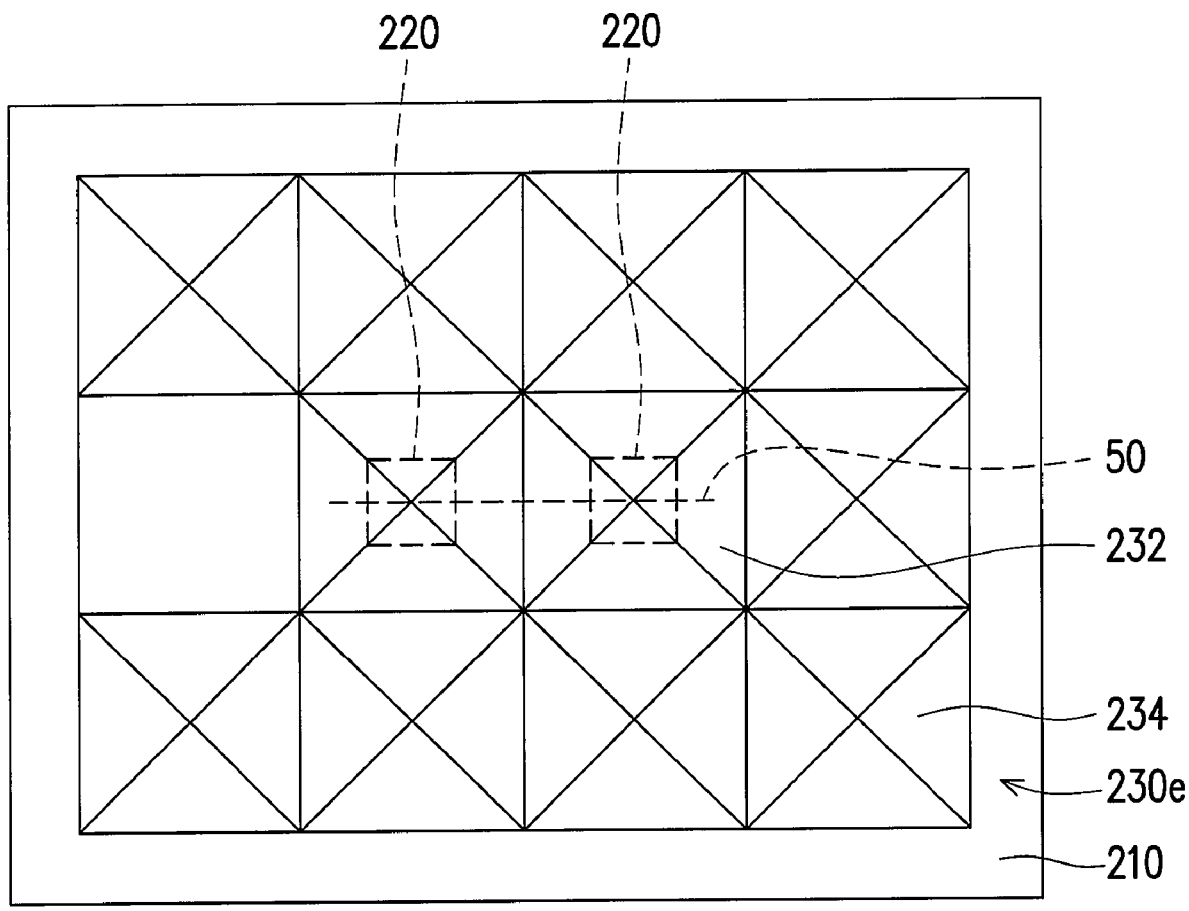
FIG. 11 is a top view of the light emitting device according to yet another embodiment of the present invention.

Referring to FIG. 11, the light emitting device 200" of the present embodiment is similar to the light emitting device 200 as shown in FIG. 4A except that the light sources 320' are arranged to a line 50. In the embodiment, the quantity of the light sources 220 is, for example, two. Furthermore, the lens array 230e is, for example, a 4×3 array wherein the quantity of the first lens 232 of the lens array 230e is two and the quantity of the second lens 234 is ten.

Figure 12:
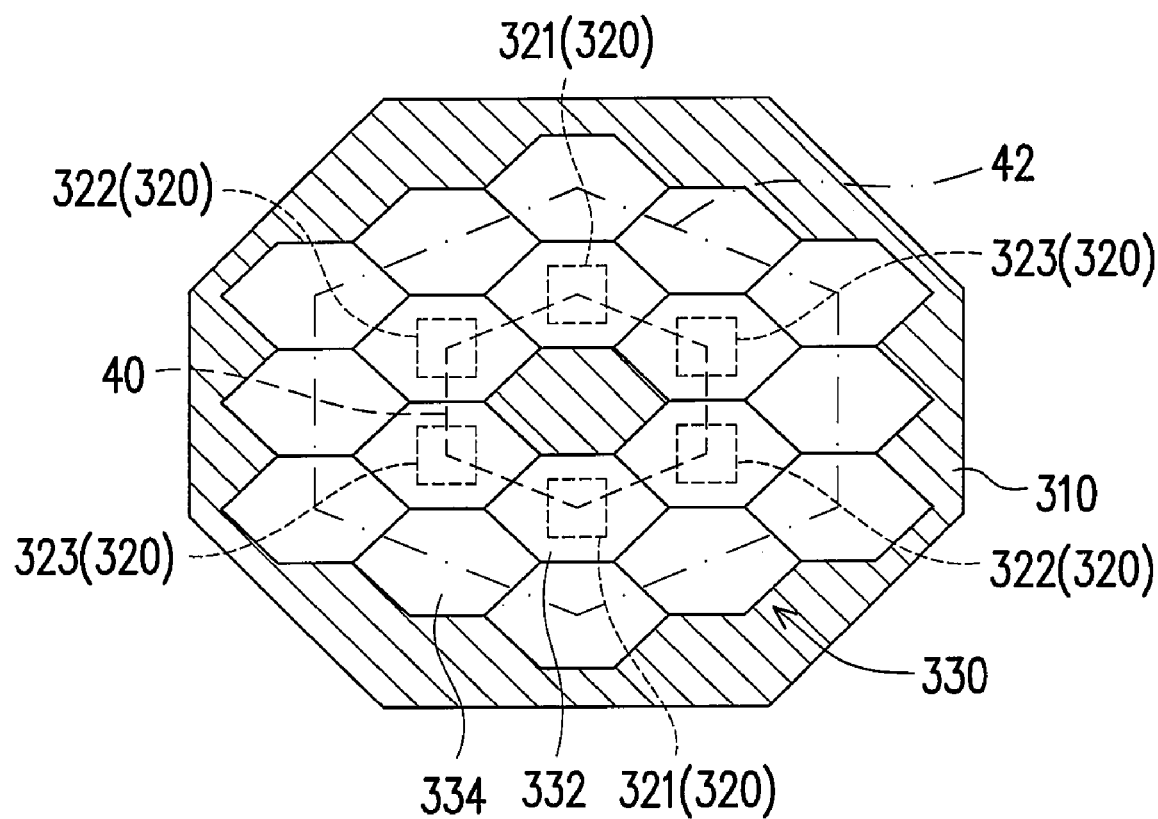
FIG. 12 is a schematic view of the light emitting device according to yet another embodiment of the present invention.

Referring to FIG. 12, the light emitting device 300 of the present embodiment comprises a substrate 310, a plurality of light sources 320 and a lens array 330, wherein the light sources 320 and the lens array 330 are disposed on the substrate 310. The quantity of the light sources 320 is six, and the light sources 320 are arranged to a hexagon 40. The lens array 330 comprises a plurality of first lenses 332 and a plurality of second lenses 334. The first lenses 332 cover the light sources 320, and respectively correspond to one of the light source 320. The second lenses 334 are, for example, arranged to a hexagon 42, so as to surround the first lenses 332. The lens array 330 is formed integrally.

In the light emitting device 300, each light source 320 is an LED chip, and the colors of the lights emitted from the light sources 320 are different; the light emitting device 300 comprises, for example, two red light sources 321, two blue light sources 322 and two green light sources 323. Moreover, the shapes of the light exit surfaces of the first lenses 332 and the second lenses 334 are determined in according with the required light-emitting pattern. More particularly, the light exit surfaces of the first lenses 332 and the second lenses 334 is recessed surfaces (e.g. pyramidal recessed surface or circular-arc recessed surface) or protruding surfaces (e.g. pyramidal protruding surface or protruding recessed surface).

The profile of the arrangement of the first lenses 332 and the second lenses 334 of the lens array 330 in the present embodiment is approximately a circle with preferred symmetry, so the distribution of the light emitting intensity of each light source 320 is more symmetric, so as to increase the blending effect of the light emitting device 300. Moreover, in order to further increase the symmetry of the distribution of the light emitting intensity of each light source 320, the lens array 330 further comprises a plurality of third lenses (not shown) surrounding the second lenses 334. Definitely, the lens array 330 further comprises more layers of lenses surrounding the third lenses.

To sum up, the light emitting device of the present embodiment has at least the following advantages.

1. Because the lens array has a plurality of second lenses which surrounds the first lenses corresponding to the light sources, the distribution of the light emitting intensity of each light source is made to be relatively symmetric.

2. Because the distribution of the light emitting intensity of each light source is relatively symmetric, under the condition that the colors of the lights emitted from the light sources are different, the light emitting device of the present invention has preferred blending effect.

3. The plurality of third lenses surrounding the second lenses is added in the lens array, so as to further increase the symmetry of the distribution of the light emitting intensity of each light source.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting device, comprising:
   a substrate;
   a plurality of light sources, disposed on the substrate; and
   a lens array, disposed on the substrate, comprising:
      a plurality of first lenses covering the light sources in a one-for-one manner and directly contacting the light sources in the one-for-one manner, wherein the light sources are embedded in the first lenses in the one-for-one manner; and a plurality of second lenses, surrounding the first lenses and the light sources and disposed beside the first lenses and the light sources, wherein each of the first lenses and the second lenses has a light exit surface facing away from the substrate, and the light exit surface is a recessed surface or a protruding surface, wherein the light sources are arranged in an N-by-N array, the lens array is an M-by-M array, both N and M are positive integers, N is smaller than M, and N is greater than 1.

2. The light emitting device as claimed in claim 1, wherein the light sources are arranged to a quadrangle.

3. The light emitting device as claimed in claim 1, wherein the light sources are arranged to a hexagon.

4. The light emitting device as claimed in claim 1, wherein the light exit surfaces of the first lenses and the second lenses are circular-arc recessed surfaces or pyramidal recessed surfaces.

5. The light emitting device as claimed in claim 1, wherein the light exit surfaces of the first lenses and the second lenses are circular-arc protruding surfaces or pyramidal protruding surfaces.

6. The light emitting device as claimed in claim 1, wherein the lens array further comprises a plurality of third lenses surrounding the second lenses, each of the third lenses has a light exit surface facing away from the substrate, and the light exit surface of each of the third lenses is a recessed surface or a protruding surface.

7. The light emitting device as claimed in claim 6, wherein the lens array is a 6×6 array.

8. The light emitting device as claimed in claim 6, wherein shapes of the light exit surfaces of the first lenses, the second lenses and the third lenses are the same.

9. The light emitting device as claimed in claim 1, wherein the light sources comprise a plurality of light-emitting diode (LED) chips.

10. The light emitting device as claimed in claim 1, wherein colors of lights emitted from the light sources are different.

11. The light emitting device as claimed in claim 1, wherein colors of lights emitted from the light sources comprise red, blue and green.

12. The light emitting device as claimed in claim 1, wherein the lens array further comprises a plurality of fourth lenses surrounding the third lenses, each of the fourth lenses has a light exit surface facing away from the substrate, and the light exit surface of each of the fourth lenses is a recessed surface or a protruding surface.

13. The light emitting device as claimed in claim 12, wherein the lens array is a 8×8 array.

14. The light emitting device as claimed in claim 1, wherein the light sources are arranged to a line.

15. The light emitting device as claimed in claim 1, wherein the light sources are arranged to a polygon.

16. The light emitting device as claimed in claim 1, wherein shapes of the light exit surfaces of the first lenses and the second lenses are the same.

* * * * *